(12) United States Patent
Kasai et al.

(10) Patent No.: US 6,239,381 B1
(45) Date of Patent: *May 29, 2001

(54) CIRCUIT BOARD FOR A SEMICONDUCTOR DEVICE AND METHOD OF MAKING THE SAME

(75) Inventors: Yoshiji Kasai; Kaoru Hära; Misao Aruga, all of Chino (JP)

(73) Assignee: Kabushiki Kaisha Eastern, Nagano (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/095,068

(22) Filed: Jun. 10, 1998

Related U.S. Application Data

(62) Division of application No. 08/834,480, filed on Apr. 11, 1997, now Pat. No. 5,824,964.

(30) Foreign Application Priority Data

Apr. 18, 1996 (JP) .................................................. 8-096722

(51) Int. Cl.⁷ ..................................................... H05K 1/00
(52) U.S. Cl. .............................. 174/252; 29/832; 29/846; 174/254; 438/107; 438/108; 361/761; 361/707; 361/719
(58) Field of Search .................................... 257/713, 723, 257/730; 361/761, 707, 719; 174/252, 254; 438/107, 113, 110, 67, 68, 108; 29/832, 846

(56) References Cited

U.S. PATENT DOCUMENTS

| 5,047,279 | 9/1991 | Nasu et al. | 428/156 |
| 5,196,738 | 3/1993 | Bean et al. | 438/107 |
| 5,508,089 | * 4/1996 | Schulz-Harder | 428/209 |
| 5,528,456 | 6/1996 | Takahashi | 361/704 |
| 5,583,378 | 12/1996 | Marrs et al. | 257/710 |
| 5,783,866 | * 7/1998 | Lee et al. | 257/780 |

FOREIGN PATENT DOCUMENTS

| 550731 | 7/1993 | (JP) . |
| 6120271 | 4/1994 | (JP) . |

* cited by examiner

*Primary Examiner*—Dean A. Reichard
*Assistant Examiner*—Hung V Ngo
(74) *Attorney, Agent, or Firm*—Birch, Stewart, Kolasch & Birch, LLP

(57) ABSTRACT

In the circuit board of the present invention, a base board has a first face and a second face, in which a plurality of sets of wire patterns, to which semiconductor chips are respectively connected, are printed on the first face. A metal plate for radiating heat is fixed on the second face of the base board. The base board includes a V-notch being formed along a border between the sets of wire patterns, and the metal plate includes a V-notch being formed to correspond to the V-notch of the base board, whereby the circuit board is divided into a plurality of circuit units, which are mutually connected by a thin section corresponding to the V-notches of the metal plate.

4 Claims, 5 Drawing Sheets

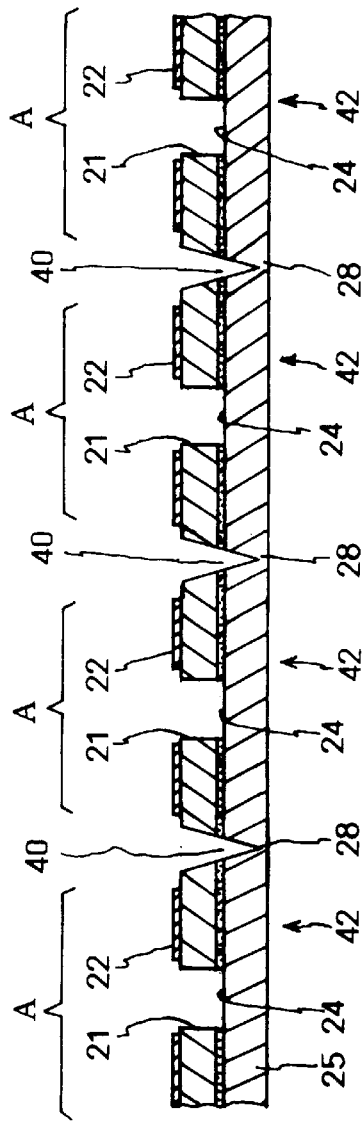
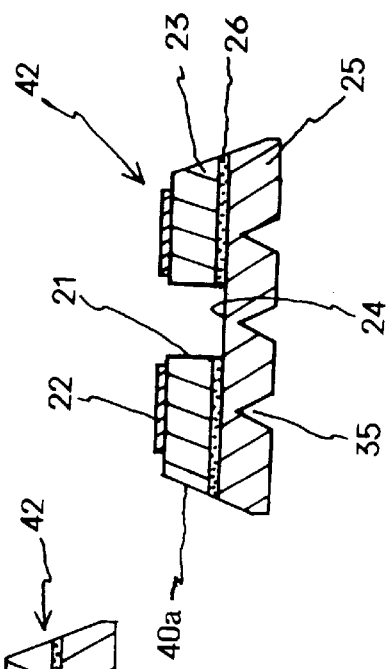
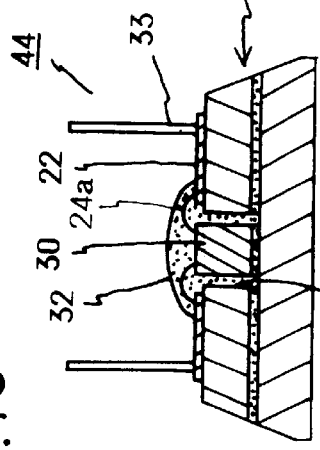
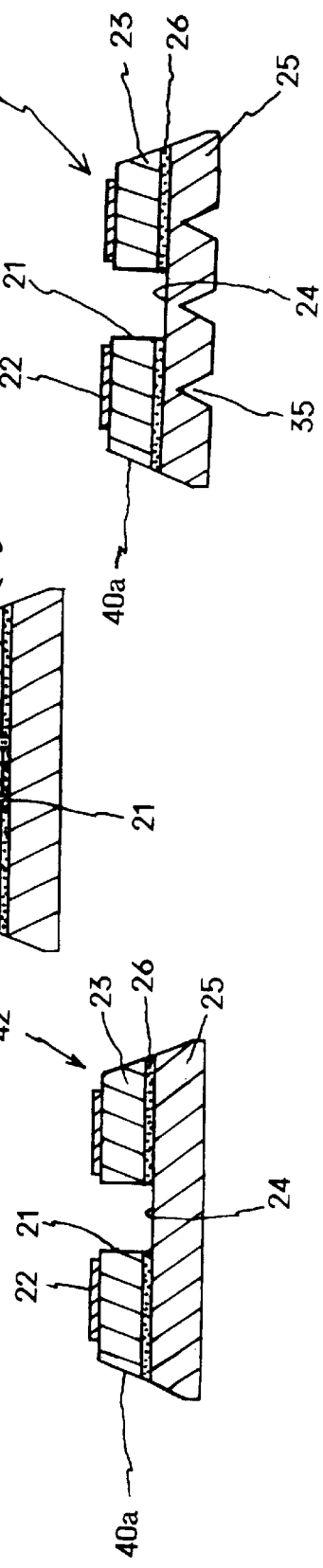

CIRCUIT BOARD FOR A SEMICONDUCTOR DEVICE AND METHOD OF MAKING THE SAME

This is a divisional of application Ser. No. 08/834,480, filed on Apr. 11, 1997 U.S. Pat. No. 5,824,964, the entire contents of which are hereby incorporated by reference.

BACKGROUND OF THE INVENTION

The present invention relates to a circuit board for a semiconductor device and a method of making the same.

In FIG. 15, a conventional circuit board 10 for a semiconductor device is shown. A metal plate 14 for radiating heat is adhered on a bottom face of a base board 12 of the circuit board 10 by an adhesive.

The base board 12 has a chip hole 15, in which an IC chip 17 is accommodated, and a set of wire patterns 18, which is electrically connected with the IC chip 17, is printed on an upper face of the base board 12. An upper face of the metal plate 14 corresponding to the chip hole 15 acts as a chip mounting section 16.

The conventional circuit board 10, which is formed into a small piece, is made by the steps of: forming the base board 12 having the chip hole 15 and the set of wire patterns 18; and fixing the metal plate 14 on the bottom face of the base board 12. Each circuit board 10 is made by these steps, so the manufacturing efficiency cannot be increased.

To improve on the method of making the conventional circuit board 10, the inventor proposed another method as shown in FIG. 16. In the method shown in FIG. 16, a plurality of circuit boards are made by the steps of: forming a common base board 12 having a plurality of chip holes 15 and a plurality of sets of wire patterns 18; fixing a common metal plate 14 for radiating heat on a bottom face of the base board 12 by an adhesive; and cutting the base board 12 and the metal plate 14 along borders between adjacent pattern units "A" by cutting means, e.g., a rooter, a die set, a press machine. By this method, a plurality of circuit boards 10, each of which is formed into a small piece, can be made.

In the method shown in FIG. 16, the common metal plate 14 is fixed by the adhesive in one step, so the manufacturing efficiency of the circuit boards 10 can be improved.

However, as shown in FIG. 17, flashes 19 are apt to be formed in cut faces of the metal plate 14.

SUMMARY OF THE INVENTION

An object of the present invention is to provide a circuit board having no flashes and a method of making the circuit board.

The circuit board of the present invention comprises:

a base board having a first face and a second face, in which a plurality of sets of wire patterns, to which semiconductor chips are respectively connected, are printed on the first face; and a metal plate for radiating heat, the metal plate being fixed on the second face of the base board, wherein the base board includes a V-notch being formed along a border between the sets of wire patterns, and the metal plate includes a V-notch being formed to correspond to the V-notch of the base board, whereby the circuit board is divided into a plurality of circuit units, which are mutually connected by a thin section corresponding to the V-notches of the metal plate.

With this structure, the circuit board is divided into a plurality of the circuit units, which are mutually connected by the thin section corresponding to the V-notches. So the circuit board can be cut along the thin section; a plurality of the circuit units, each of which is formed into a small piece, can be easily made without forming the flashes.

Side faces of the circuit units are formed into chamfered sections by the V-notches.

If a groove is formed on an exposed face of the metal plate, heat can be effectively radiated.

The method of the present invention comprises the steps of:

forming a base board having a first face and a second face, in which a plurality of sets of wire patterns, to which semiconductor chips are respectively connected, are printed on the first face;

fixing a metal plate for radiating heat on the second face of the base board;

forming a V-notch in the first face of the base board along a border between the sets of wire patterns;

forming a V-notch formed in the metal plate to correspond to the V-notch of the base board; and cutting the base board and the metal plate along a thin section corresponding to the V-notches of the metal plate, whereby the circuit board is divided into a plurality of circuit units.

With these steps, a plurality of the circuit units can be easily made by cutting along the thin section, so that the manufacturing efficiency of the circuit units can be increased.

Another circuit board of the present invention comprises:

a base board having a first face and a second face, in which a plurality of sets of wire patterns, to which semiconductor chips are respectively connected, are printed on the first face; and a metal plate for radiating heat, the metal plate being fixed on the second face of the base board, wherein the base board includes a V-notch, which reaches the metal plate, being formed along a border between the sets of wire patterns, whereby the circuit board is divided into a plurality of circuit units, which are mutually connected by a thin section corresponding to the V-notch.

With this structure, a plurality of the circuit units are mutually connected by the thin section corresponding to the V-notch, so With this structure, the circuit board can be cut along the V-notch; a plurality of the circuit units, each of which is formed into a small piece, can be easily made without forming the flashes.

Side faces of the circuit units are formed into chamfered sections by the V-notches.

If a groove is formed on an exposed face of the metal plate, heat can be effectively radiated.

Another method of the present invention comprises the steps of:

forming a base board having a first face and a second face, in which a plurality of sets of wire patterns, to which semiconductor chips are respectively connected, are printed on the first face;

fixing a metal plate for radiating heat on the second face of the base board;

forming a V-notch, which reaches the metal plate, in the base board along a border between the sets of wire patterns;

cutting the base board and the metal plate along a thin section corresponding to the V-notch of the metal plate, whereby the circuit board is divided into a plurality of circuit units.

With these steps, the V-notch is mainly formed in the base board, namely on the base board side only. So cutting steps can be reduced. And an outer face of the metal plate is flat, so the circuit board can be stably conveyed on a manufacturing line. By cutting along the thin section, the circuit units can be made easily. Further, a sectional shape of the circuit unit is formed into a trapezoid, so it can be stably conveyed on the manufacturing line, and the manufacturing efficiency can be increased.

BRIEF DESCRIPTION OF THE DRAWINGS

Embodiments of the present invention will now be described by way of examples and with reference to the accompanying drawings, in which:

FIG. 8 is a sectional view of a the circuit board of Second Embodiment in which the base board and the metal plate have V-notches;

FIG. 9 is a sectional view of a circuit unit of the Second Embodiment;

FIG. 10 is a sectional view of a semiconductor device employing the circuit unit of the Second Embodiment;

FIG. 11 is a sectional view of the circuit unit of the Second Embodiment, which has grooves;

DETAILED DESCRIPTION OF THE PREFERRED EMBODIMENTS

Preferred embodiments of the present invention will now be described in detail with reference to the accompanying drawings.

A First Embodiment is shown in FIGS. 1–7.

Figure 1:
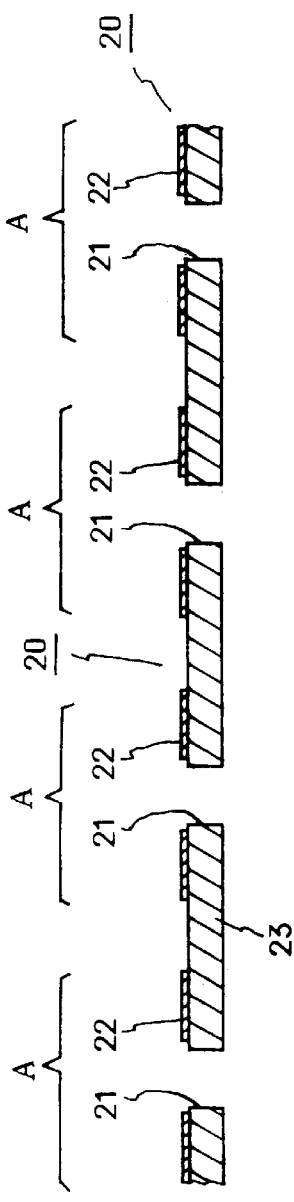
FIG. 1 is a sectional view of a base board on which a plurality of sets of wire patterns are formed.

FIG. 1 is a sectional view of a base board 20. A plurality of chip holes 21 are formed and linearly arranged in a plastic board 23 and a plurality of wire pattern units "A" are formed and linearly arranged on the plastic board 23.

A plurality of sets of wire patterns 22 are formed by the steps of: sticking metal leaf, e.g., copper leaf, on an upper face of the plastic board 23; and etching the metal leaf to form the wire patterns.

For example, the thickness of the base board 20 is 0.3–0.5 mm. Note that, the base board 20 may be a multi layered base board.

Figure 2:
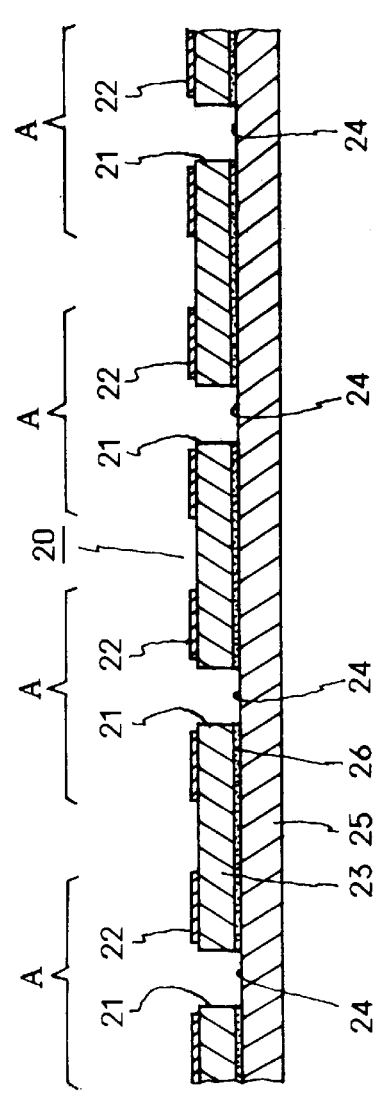
FIG. 2 is a sectional view of the base board shown in FIG. 1 to which a metal plate is fixed.

In FIG. 2, a metal plate 25, e.g., a copper plate, for radiating heat is fixed on a bottom face of the base board 20 by adhesive 26. The metal plate 25 closes the chip holes 21 and covers over the whole bottom face of the base board 20. Parts of the upper face of the metal plate 25, which constitute inner bottom faces of the chip holes 21, act as chip mounting sections 24. The thickness of the metal plate 25 is about 0.5 mm but it is not limited.

Figure 3:
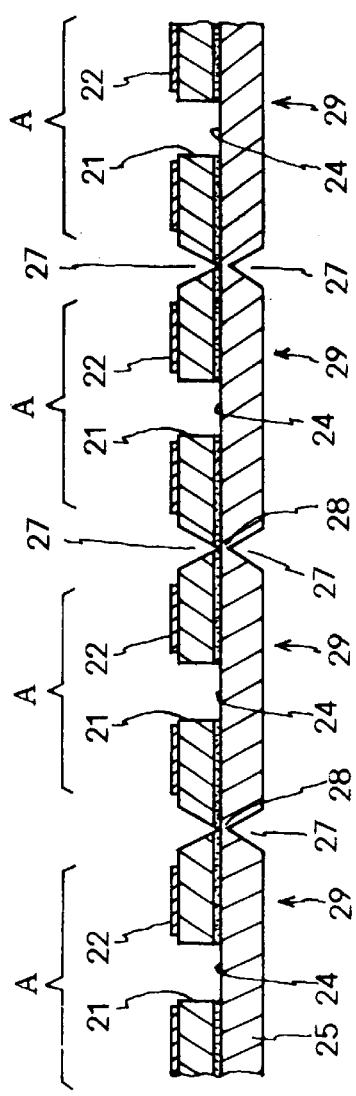
FIG. 3 is a sectional view of a the circuit board of First Embodiment in which the base board and the metal plate have V-notches.
Figure 4:
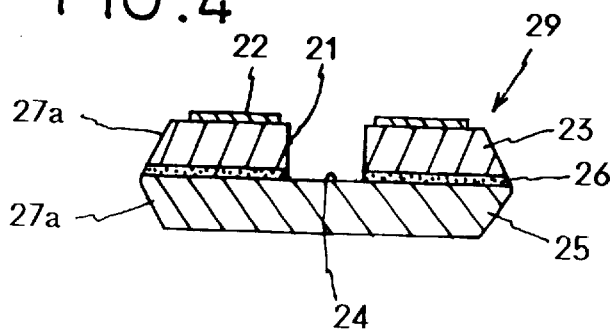
FIG. 4 is a sectional view of a circuit unit of the First Embodiment.

Next, as shown in FIG. 3, V-notches 27 are formed along borders between the pattern units "A" of the base board 20 and the metal plate 25. By forming the V-notches 27, the circuit board is divided into a plurality of circuit units 29, which are mutually connected by thin sections 28 of the metal plate 25 corresponding to the V-notches 27.

The circuit board including the plurality of the circuit units 29 is supplied to users. Of course, the circuit board may be cut along the thin sections 28 to form into the circuit units 29, each of which is formed into a small piece (see FIG. 4), and the circuit units 29 may be supplied to the users. Side faces of the circuit unit 29 have chamfered sections 27a, which were inner faces of the V-notches 27.

To manually easily cut the thin sections 28, the thickness of the thin sections 28 is preferably designed to be 0.1–0.2 mm. Of course, the thin sections 28 may be cut by a press machine, etc.. Since the thin section 28 is cut, no flashes are formed in the circuit units 29.

Figure 5:
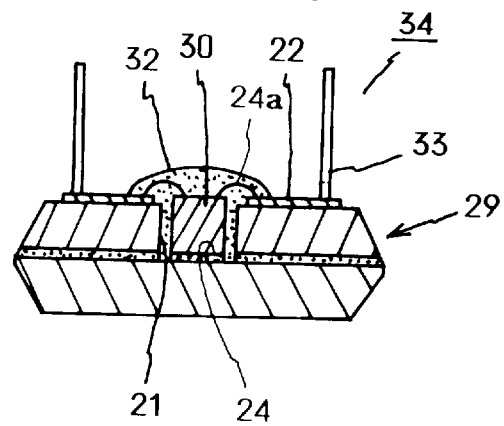
FIG. 5 is a sectional view of a semiconductor device employing the circuit unit of the First Embodiment.

As shown in FIG. 5, a semiconductor element 30, e.g., an IC chip, is mounted on the chip mounting section 24. The semiconductor element 30 is electrically connected with the wire patterns 22 by wires 24a. The semiconductor element 30 is air-tightly molded by a resin 32. Finally, electric terminals 33 are connected to the wire patterns 22, so that a semiconductor device 34 is completed. Note that, the electric terminals 33 may be pins, solder balls, etc..

Figure 6:
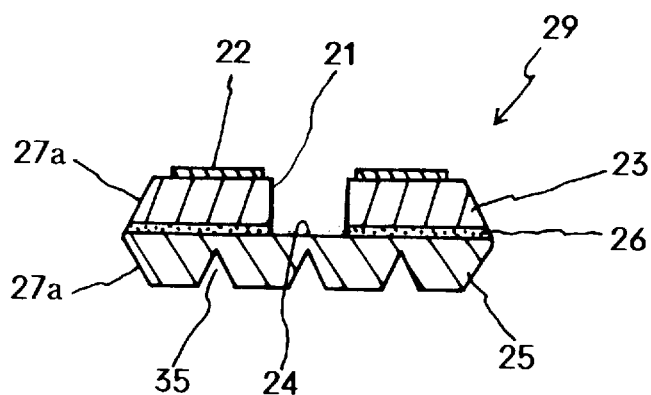
FIG. 6 is a sectional view of the circuit unit of the First Embodiment, which has grooves.

As shown in FIG. 6, groves 35 may be formed in an outer face (a bottom face) of the metal plate 25 of the circuit unit 29. By forming the grooves 35, heat radiating efficiency can be increased.

Figure 7:
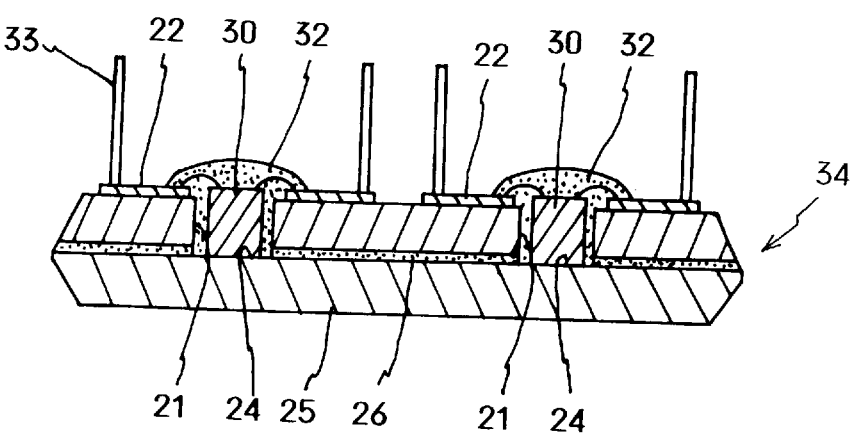
FIG. 7 is a sectional view of a multi chip module (MCM) type semiconductor device employing the circuit unit of the First Embodiment.

In the First Embodiment, the circuit unit 29 having one semiconductor element 30 has been explained. But the circuit unit 29 may be applied to a multi chip module (MCM) type semiconductor device 34 as shown in FIG. 7. In the case of the MCM type semiconductor device 34, each pattern unit "A" (see FIG. 3) includes a plurality of chip holes 21 and a plurality of sets of wire patterns 22; the V-notches 27 are, of course, formed along the borders between said pattern units "A".

Next, a Second Embodiment will be explained with reference to FIGS. 8–12. Note that, elements explained in the First Embodiment are assigned the same numeric symbols and explanation will be omitted.

In FIG. 8, V-notches 40 are formed along borders between the adjacent pattern units "A". The V-notches 40 are formed in the base board 20, and the V-notches 40 reach the metal plate 25. With this structure, a plurality of circuit units 42 are mutually connected by thin sections 28 of the metal plate 25 corresponding to the V-notches 40. The circuit board including the plurality of the circuit units 42 is supplied to users.

Of course, the circuit board may be cut along the thin sections 28 to form into the circuit units 42, each of which is formed into a small piece (see FIG. 9), and the circuit units 42 may be supplied to the users. Side faces of the circuit unit 42 have chamfered sections 40a, which were inner faces of the V-notches 40.

As shown in FIG. 10, the semiconductor element 30 is mounted on the chip mounting section 24. The semiconductor element 30 is electrically connected with the wire patterns 22 by the wires 24a. The semiconductor element 30 is air-tightly molded by the resin 32. Finally, electric terminals 33 are connected to the wire patterns 22, so that a semiconductor device 44 is completed. Note that, the electric terminals 33 may be pins, solder balls, etc. as well as in the First Embodiment.

As shown in FIG. 11, the groves 35 may be formed in the outer face of the metal plate 25 of the circuit unit 42. By forming the grooves 35, the heat radiating efficiency of the semiconductor device 44 can be increased.

Figure 12:
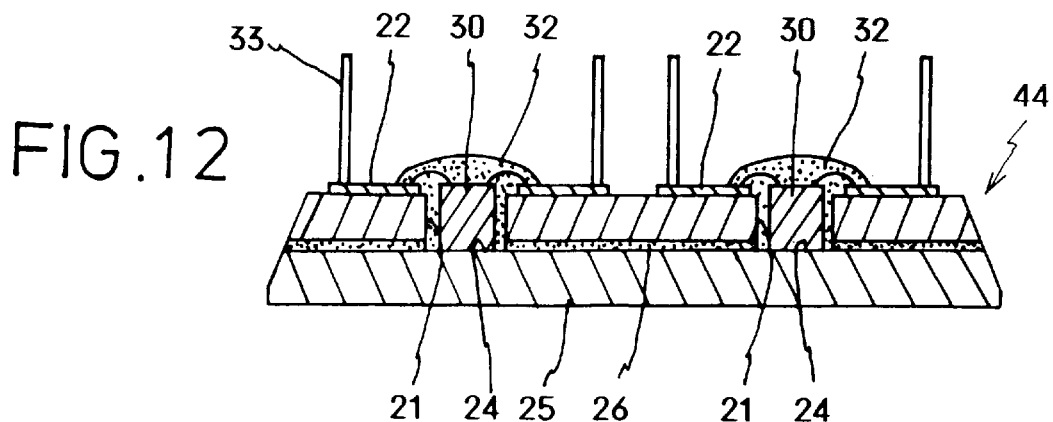
FIG. 12 is a sectional view of an MCM type semiconductor device employing the circuit unit of the Second Embodiment.

In the Second Embodiment, the circuit unit 42 having one semiconductor element 30 has been explained. But the circuit unit 42 may be applied to the MCM type semiconductor device 44 as shown in FIG. 12. In the case of the MCM type semiconductor device 44, each pattern unit "A" (see FIG. 8) includes a plurality of chip holes 21 and a plurality of sets of wire patterns 22; the V-notches 40 are, of course, formed along the borders between said pattern units "A".

A Third Embodiment will be explained with reference to FIGS. 13 and 14. Note that, elements explained in the First and the Second Embodiments are assigned the same numeric symbols and detailed explanation will be omitted.

In the First and the Second Embodiments, there are formed the chip holes 21 in the base board 20, and the inner bottom faces of the chip holes 21, which are the upper face of the metal plate 25, act as the chip mounting sections 24. In the Third Embodiment, no chip holes are formed in the base board 20; the semiconductor chips are mounted on the base board 20.

Figure 13:
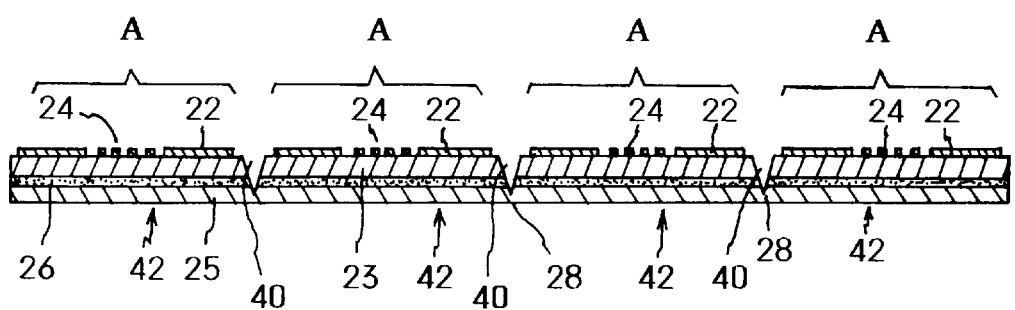
FIG. 13 is a sectional view of a the circuit board of Third Embodiment.

In FIG. 13, the metal plate 25 for radiating heat is fixed on the bottom face of the plastic board 23 by the adhesive 26. The wire patterns 22 including chip mounting sections 24 are formed on the upper face of the plastic board 23. A plurality of the wire pattern units "A" are formed and linearly arranged on the plastic board 23.

The V-notches 40 are formed along borders between the adjacent wire pattern units "A". The V-notches 40 are formed in the base board 20, and the V-notches 40 reach the metal plate 25. With this structure, a plurality of circuit units 42 are mutually connected by thin sections 28 of the metal plate 25 corresponding to the V-notches 40.

The circuit board including the plurality of the circuit units 42 is supplied to users. Of course, the circuit board may be cut along the thin sections 28 to form into the circuit units 42, each of which is formed into a small piece, and the circuit units 42 may be supplied to the users as well as in the foregoing embodiments. The circuit board can be easily cut along the thin sections 28. Side faces of the circuit unit 42 have chamfered sections, which were inner faces of the V-notches 40 as well as in the First and the Second Embodiments.

Figure 14:
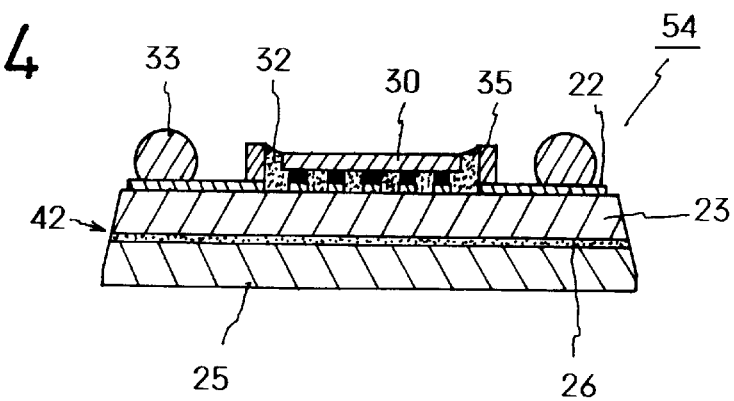
FIG. 14 is a sectional view of a semiconductor device employing the circuit unit of the Third Embodiment.
Figure 15:
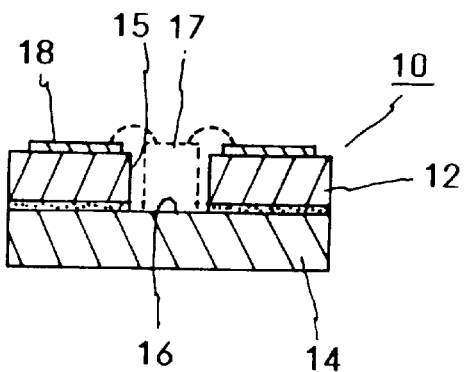
FIG. 15 is a sectional view of the conventional circuit board.
Figure 16:
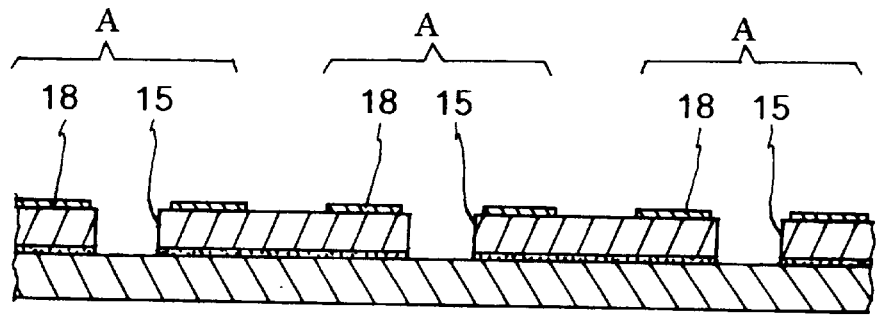
FIG. 16 is a sectional view of another conventional circuit board.
Figure 17:
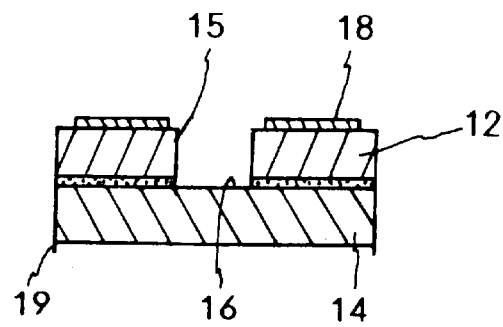
FIG. 17 is a sectional view showing the flashes of the conventional circuit board.

As shown in FIG. 14, the semiconductor element 30 is mounted on the chip mounting section 24. The semiconductor element 30 is electrically connected with the wire patterns 22 by a flip-chip connection method. The semiconductor element 30 is air-tightly molded by the resin 32. Note that, a dam section 35 is fixed on the plastic board 23, and the dam section 35 encloses the chip mounting section 24 to prevent resin leakage. Finally, electric terminals 33 are connected to the wire patterns 22, so that a semiconductor device 54 is completed. Note that, the electric terminals 33 may be pins, solder balls, etc. as well as the First and the Second Embodiments.

The circuit board of the Third Embodiment can be made by the steps of:

forming the base board 23 having the upper face and the bottom face, in which a plurality of the sets of wire patterns "A", to which the semiconductor chips 30 are respectively connected, are printed on the upper face;

fixing the metal plate 25 for radiating heat on the bottom face of the base board 23;

forming the V-notches 40 which reach the metal plate 25, in the upper face of the base board 23 along the borders between the adjacent sets of wire patterns "A"; and cutting the base board 23 and the metal plate 25 along the thin sections 28 of the metal plate 25 corresponding to the V-notches 40 of the base board 23 and the metal plate 25, whereby the circuit board is divided into a plurality of the circuit units 42, which are mutually connected by the thin sections 28.

In the present invention, the circuit board is divided in to a plurality of the circuit units, which are mutually connected by the thin sections corresponding to the V-notches of the metal plate. Therefore the circuit board can be cut along the thin sections, so that a plurality of the circuit units, each of which is formed into a small piece, can be easily made without forming the flashes. Since the circuit board can be easily cut along the thin section, the manufacturing efficiency of the circuit units can be increased.

In the case of forming the V-notches on the base board side until reaching the metal plate too, since a plurality of the circuit units are mutually connected by the thin section in the metal plate, the circuit units can be easily cut and separated without forming flashes. The circuit board can be easily cut along the thin section, so the manufacturing efficiency of the circuit units can be increased. Further, the V-notch is made on only one side (the base board side), so cutting steps can be reduced. The outer (bottom) face of the metal plate is made as a flat face, so the circuit board can be stably conveyed on a manufacturing line. By cutting along the thin section, the circuit units can be made easily. A sectional shape of the circuit unit is formed into the trapezoid, so the circuit unit can be stably conveyed on the manufacturing line, and the manufacturing efficiency can be increased.

The invention may be embodied in other specific forms without departing the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A circuit board for a semiconductor device, being made by the steps of:

forming a base board having a first face and a second face, a plurality of sets of wire patterns, to which semiconductor chips are respectively connected, are printed on the first face;

fixing a metal plate for radiating heat on the second face of said base board;

forming only one V-notch which extends completely through said base board and partially into said metal plate along a border between the sets of wire patterns, a thin section being formed in the metal plate; and cutting said base board and said metal plate along said thin section corresponding to the V-notch, whereby said circuit board has a chamfered section corresponding to the V-notch.

2. The circuit board according to claim 1, further comprising a plurality of chip holes, in which the semiconductor chips are respectively accommodated, formed in the first face of said base board.

3. A method of making a circuit board for a semiconductor device, comprising the steps of:

forming a base board having a first face and a second face, a plurality of sets of wire patterns, to which semiconductor chips are respectively connected, are printed on the first face;

fixing a metal plate for radiating heat on the second face of said base board;

forming only one V-notch extending completely through said base board and partially into said metal plate along a border between the sets of wire patterns, a thin section being formed in the metal plate; and cutting said base board and said metal plate along said thin section corresponding to the V-notch of said metal plate, whereby said circuit board is divided into a plurality of circuit units.

4. The method according to claim 3, further comprising the step of forming a plurality of chip holes, in which the semiconductor chips are respectively accommodated, in the first face of said base board.

* * * * *